(12) United States Patent
Koba et al.

(10) Patent No.: US 10,976,372 B2
(45) Date of Patent: *Apr. 13, 2021

(54) BATTERY STATE ESTIMATION DEVICE AND BATTERY STATE ESTIMATION METHOD

(71) Applicant: PRIMEARTH EV ENERGY CO., LTD., Kosai (JP)

(72) Inventors: Daisuke Koba, Toyohashi (JP); Yosuke Murota, Kosai (JP); Shinobu Minatani, Nishinomiya (JP); Hiroki Nakafuji, Toyohashi (JP); Daisuke Shinohara, Kosai (JP); Tetsuya Osaka, Tokyo (JP)

(73) Assignee: PRIMEARTH EV ENERGY CO., LTD., Kosai (JP)

( * ) Notice: Subject to any disclaimer, the term of this patent is extended or adjusted under 35 U.S.C. 154(b) by 355 days.

This patent is subject to a terminal disclaimer.

(21) Appl. No.: 16/231,176

(22) Filed: Dec. 21, 2018

(65) Prior Publication Data

US 2019/0195960 A1 Jun. 27, 2019

(30) Foreign Application Priority Data

Dec. 27, 2017 (JP) .............................. JP2017-250897
Jun. 13, 2018 (JP) .............................. JP2018-112651

(51) Int. Cl.
*G01R 31/396* (2019.01)
*G01R 31/389* (2019.01)
(Continued)

(52) U.S. Cl.
CPC ....... *G01R 31/389* (2019.01); *G01R 31/3648* (2013.01); *G01R 31/374* (2019.01); *G01R 31/396* (2019.01); *G01R 31/367* (2019.01)

(58) Field of Classification Search
CPC .... G01R 31/36; G01R 31/374; G01R 31/389; G01R 31/396; G01R 31/3648;
(Continued)

(56) References Cited

U.S. PATENT DOCUMENTS 9,531,040 B2    12/2016 Osaka et al.
10,281,530 B2 *  5/2019 Nishi .................... G01R 31/367
(Continued)

FOREIGN PATENT DOCUMENTS

EP          2811310 A4 *  4/2015  .......... G01R 31/389
WO       2014/054796 A1    4/2014

OTHER PUBLICATIONS

14. Sathyanarayana et al. "Impedance parameters and the state-of-charge. I. Nickel-cadmium battery", Journal of Applied Electrochemistry 9 (1979), pp. 125-139 (Year: 1979).*

*Primary Examiner* — Melissa J Koval
*Assistant Examiner* — Courtney G McDonnough
(74) *Attorney, Agent, or Firm* — Maschoff Brennan

(57) ABSTRACT

A battery state estimation device for estimating a charged electric charge quantity of a rechargeable battery includes an impedance measurement unit configured to measure a plurality of complex impedances of the rechargeable battery by supplying measurement power to the rechargeable battery, a parameter calculation unit configured to calculate a parameter that includes a ratio of a difference between measurement angular velocities of two complex impedances in a diffusion region among the measured complex impedances to a difference between components of the two complex impedances, and an electric charge quantity estimation unit configured to estimate a charged electric charge quantity of the rechargeable battery based on the calculated parameter (Continued)

and preset correlated information between the charged electric charge quantity of the rechargeable battery and the parameter.

13 Claims, 8 Drawing Sheets

(51) Int. Cl.
*G01R 31/374* (2019.01)
*G01R 31/36* (2020.01)
*G01R 31/367* (2019.01)

(58) Field of Classification Search
CPC ............. G01R 31/367; G01R 31/3624; H01M 10/486; H01M 10/443; H01M 10/0431; H01M 10/0525; H02J 7/047
USPC ........................................................ 324/430
See application file for complete search history.

(56) References Cited

U.S. PATENT DOCUMENTS

| | | | |
|---|---|---|---|
| 10,429,444 B2* | 10/2019 | Koba | H02J 7/00716 |
| 2012/0303208 A1* | 11/2012 | Hariharan | H01M 10/48 |
| | | | 701/32.9 |
| 2018/0321326 A1* | 11/2018 | Tanaka | G01R 31/367 |

\* cited by examiner

BATTERY STATE ESTIMATION DEVICE AND BATTERY STATE ESTIMATION METHOD

CROSS-REFERENCE TO RELATED APPLICATIONS

This application is based upon and claims the benefit of priority from prior Japanese Patent Applications No. 2017-250897, filed on Dec. 27, 2017 and No. 2018-112651, filed on Jun. 13, 2018, the entire contents of which are incorporated herein by reference.

BACKGROUND

The present invention relates to a battery state estimation device and a battery state estimation method for estimating a battery state of a rechargeable battery such as a charged electric charge quantity and a battery temperature.

A nickel-metal hydride rechargeable battery or a lithium ion rechargeable battery has high energy density and is thereby employed as an in-vehicle power source for vehicles such as an electric vehicle and a hybrid vehicle.

Complex impedance analysis is performed on the rechargeable battery to determine the battery state of such a rechargeable battery (for example, refer to International Publication No. 2014/054796).

International Publication No. 2014/054796 describes a device that measures deterioration of a rechargeable battery. The device includes a rechargeable battery, a storage unit configured to store inherent information, and a temperature measurement unit configured to measure a temperature of the rechargeable battery. The inherent information includes a measurement frequency, a measurement temperature, and an initial critical capacity of a rechargeable battery having the same specification as the measured rechargeable battery. The device also includes a power supply unit and a complex impedance measurement unit. Based on the information stored in the storage unit, the power supply unit applies an alternating current signal having a measurement frequency ranging from 0.5 mHz or greater to less than 10 mHz to the rechargeable battery at a temperature ranging from 40° C. or greater to 70° C. or less. The complex impedance measurement unit measures a complex impedance of the rechargeable battery (see vertical region dc of impedance curve L121 in FIG. 12) based on an alternating current signal applied by the power supply unit. Furthermore, the device detects deterioration from a critical capacity of the rechargeable battery calculated from a measurement value of the complex impedance measurement unit and the initial critical capacity stored in the storage unit.

As shown in FIG. 12, the impedance curve L121 in a Nyquist diagram generally contains a plurality of regions corresponding to bands of measurement frequencies. Specifically, in response to a change in frequency from a band on the high frequency side to a band on the low frequency side, the impedance curve L121 is divided into "region a" corresponding to a circuit resistance, "region b" corresponding to a solution resistance, "region c" corresponding to a complex impedance caused by the reaction resistance, and "diffusion region d" corresponding to a substantially linear diffusion resistance. According to the device described in International Publication No. 2014/054796, the "diffusion region d" is divided into a "linear region da" continuous from "region c," and a "vertical region dc" that is a region on the low-frequency side with respect to the "linear region da." Deterioration of the rechargeable battery is measured based on a value of an imaginary component of the "vertical region dc." However, in the "linear region da," a ratio of a change amount of the imaginary component to a change amount of a real component lies in a range of predetermined values close to "1." The imaginary component greatly changes in comparison with the real component in the "vertical region dc" and changes substantially vertically in the Nyquist diagram.

However, according to the above technology utilizing the "vertical region dc" on the lower frequency side in the "diffusion region d," a certain length of time is required for measurement of the complex impedance. In this case, timely acquisition of the battery state is difficult.

SUMMARY

Accordingly, one object of the present invention is to provide a battery state estimation device and a battery state estimation method capable of reducing a time required for estimating a battery state based on a complex impedance.

One aspect of the present invention is a battery state estimation device for estimating a charged electric charge quantity of a rechargeable battery. The battery state estimation device includes an impedance measurement unit, a parameter calculation unit, and an electric charge quantity estimation unit. The impedance measurement unit is configured to measure a plurality of complex impedances of the rechargeable battery by supplying measurement power to the rechargeable battery. The parameter calculation unit is configured to calculate a parameter that includes a ratio of a difference between measurement angular velocities of two complex impedances in a diffusion region among the measured complex impedances to a difference between components of the two complex impedances. The electric charge quantity estimation unit is configured to estimate a charged electric charge quantity of the rechargeable battery based on the calculated parameter and preset correlated information between the charged electric charge quantity of the rechargeable battery and the parameter.

A further aspect of the present invention is a battery state estimation method for estimating a charged electric charge quantity of a rechargeable battery. The battery state estimation method includes measuring a plurality of complex impedances of the rechargeable battery by supplying measurement power to the rechargeable battery, calculating a parameter that includes a ratio of a difference between measurement angular velocities of two complex impedances in a diffusion region among the measured complex impedances to a difference between components of the two complex impedances, and estimating a charged electric charge quantity of the rechargeable battery based on the calculated parameter and preset correlated information between the charged electric charge quantity of the rechargeable battery and the parameter.

According to such a configuration or method, the charged electric charge quantity of the battery can be estimated based on the measurement result of the complex impedance. For example, the complex impedance in the diffusion region of the rechargeable battery is measured in a low frequency band of 0.1 Hz or less. Measurement of this complex impedance requires a relatively long time. However, reduction of the time required for estimating the charged electric charge quantity of the rechargeable battery is achievable by using only two frequencies in the low frequency band. In other words, the frequency range within the diffusion region often lies at 0.1 Hz or less. Even when a frequency ranging from 0.1 Hz to 0.01 Hz is used for measurement, for example, measurement is achievable within a practical time range from about 10 seconds to 100 seconds.

Moreover, the complex impedance linearly changes. Accordingly, fewer limitations are imposed on selection of the measurement frequencies of the two complex impedances, and the difference between the components of the complex impedances can be easily acquired.

The preset information may be one item of information corresponding to a model. However, the preset information may be information selected from a plurality of models set for each of temperatures of the rechargeable battery.

In addition, the imaginary component included in the components of the two complex impedances within the diffusion region can be used for estimating the battery state of the rechargeable battery. However, when there is a correlation between the imaginary component and the real component, the real component may be used for estimating the battery state of the rechargeable battery instead of the imaginary component.

Another aspect of the present invention is a battery state estimation device for estimating a temperature of a rechargeable battery. The battery state estimation device includes an electric charge quantity acquisition unit, an impedance measurement unit, a parameter calculation unit, and a temperature estimation unit. The electric charge quantity acquisition unit is configured to acquire a charged electric charge quantity of the rechargeable battery. The impedance measurement unit is configured to measure a plurality of complex impedances of the rechargeable battery by supplying measurement power to the rechargeable battery. The parameter calculation unit is configured to calculate a parameter that includes a ratio of a difference between measurement angular velocities of two complex impedances in a diffusion region among the measured complex impedances to a difference between components of the two complex impedances. The temperature estimation unit is configured to estimate a temperature of the rechargeable battery by applying the acquired charged electric charge quantity and the calculated parameter to preset information indicating a relationship between the parameter for the charged electric charge quantity of the rechargeable battery and the temperature of the rechargeable battery.

A further aspect of the present invention is a battery state estimation method for estimating a temperature of a rechargeable battery. The battery state estimation method includes acquiring a charged electric charge quantity of the rechargeable battery, measuring a plurality of complex impedances of the rechargeable battery by supplying measurement power to the rechargeable battery, calculating a parameter that includes a ratio of a difference between measurement angular velocities of two complex impedances in a diffusion region among the measured complex impedances to a difference between components of the two complex impedances, and estimating a temperature of the rechargeable battery by applying the acquired charged electric charge quantity and the calculated parameter to preset information indicating a relationship between the parameter for the charged electric charge quantity of the rechargeable battery and a temperature of the rechargeable battery.

According to such a configuration or method, the temperature of the battery can be estimated based on the measurement result of the complex impedance. For example, the complex impedance in the diffusion region of the rechargeable battery is measured in a low frequency band of 0.1 Hz or less. Measurement of this complex impedance requires a relatively long time. However, reduction of the time required for estimating the temperature of the battery is achievable by using only two frequencies in the low frequency bands.

Generally, the temperature of the battery is measured on the surface of the battery. In this case, a temperature of an electrode plate group that greatly affects charging and discharging is impossible to acquire. According to this configuration, however, the temperature of the electrode plate group is estimated as the temperature of the battery based on a state of a portion of a current flow in the electrode plate group. Therefore, the temperature of the battery can be acquired with high accuracy.

According to the present invention, a time required for measuring a battery state based on a complex impedance can be reduced.

BRIEF DESCRIPTION OF THE DRAWINGS

FIG. 13A is a graph of measurement current and voltage, FIG. 13B is a graph corresponding to FIG. 13A after frequency transform, and FIG. 13C is a Nyquist diagram formed from an impedance calculated from a result of FIG. 13B.

DESCRIPTION OF THE EMBODIMENTS

First Embodiment

A battery state estimation device and a battery state estimation method according to a first embodiment will be described with reference to FIGS. 1 to 7. For example, the battery state estimation device and the battery state estimation method herein are used for estimating a battery state of a battery 10 mounted on a vehicle, such as a rechargeable battery. In the first embodiment, the battery state of the battery 10 includes a charged electric charge quantity. The battery 10 is a nickel-metal hydride rechargeable battery. The charged electric charge quantity is a value calculated from a total capacity of the battery and a state of charge (SOC). The charged electric charge quantity correlates with a value of the SOC. The total capacity of the battery herein is a predetermined electric charge quantity, which is an electric charge quantity chargeable to a new battery. The SOC is a ratio (%) of the charged electric charge quantity to the total capacity of the battery. The charged electric charge quantity, the total capacity of the battery, and the SOC have a relationship expressed as "charged electric charge quantity=total battery capacity×SOC." In the following description, both the charged electric charge quantity and the SOC will be used for convenience of description.

Initially described with reference to FIG. 1 will be configurations of a measurement circuit 5 that measures characteristics of the battery 10, and an estimation device 30 that is a battery state estimation device for estimating a charged electric charge quantity of the battery 10.

Figure 1:
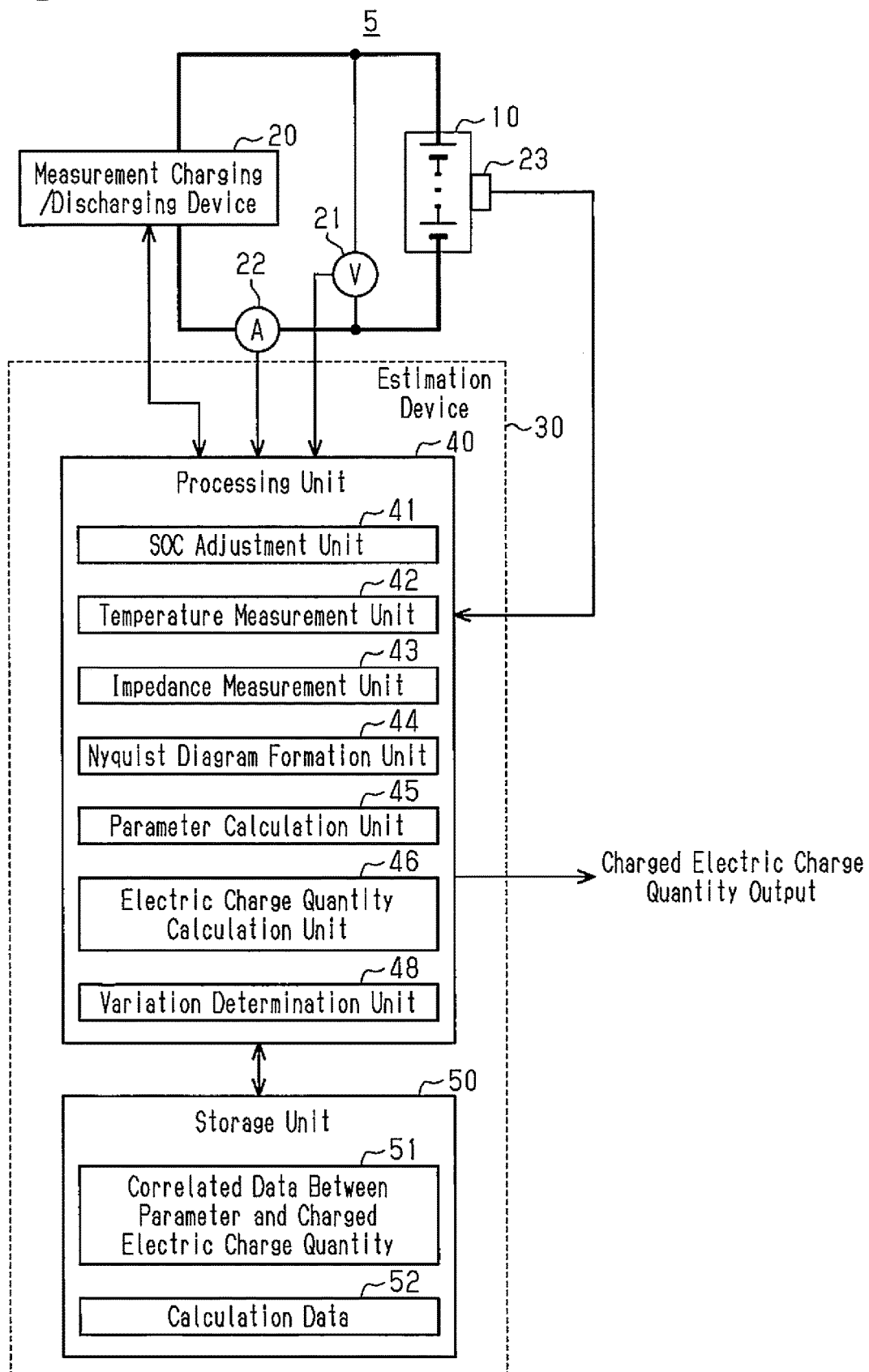
FIG. 1 is a block diagram showing a schematic configuration of a battery state estimation device according to a first embodiment.

As shown in FIG. 1, the measurement circuit 5 configured to measure the characteristics of the battery 10 includes the battery 10, and a measurement charging/discharging device 20 that supplies direct current or alternating current between a plurality of terminals of the battery 10. The measurement circuit 5 further includes a voltage measuring device 21 which measures voltage between the plurality of terminals of the battery 10, and a current measuring device 22 which measures current flowing between the measurement charging/discharging device 20 and the battery 10.

The measurement charging/discharging device 20 is capable of charging a predetermined current amount of direct current to the battery 10, and discharging a predetermined current amount of direct current from the battery 10. More specifically, the measurement charging/discharging device 20 is capable of adjusting the SOC (charged electric charge quantity) of the battery 10.

The measurement charging/discharging device 20 is capable of supplying alternating current for impedance measurement to the battery 10. The measurement charging/discharging device 20 generates alternating current having a predetermined measurement frequency, and outputs the generated alternating current between the plurality of terminals of the battery 10. The measurement charging/discharging device 20 is capable of changing a measurement frequency of alternating current. Output current and a frequency range of the measurement frequency of the measurement charging/discharging device 20 are preset. In other words, the measurement charging/discharging device 20 is capable of changing the measurement frequency of the output current, which is alternating current having a set value, within a set frequency range. For example, the set frequency range covers a range from 100 kHz on the high frequency side to 1 mHz on the low frequency side. However, the present invention is not limited to this example. The high frequency side may be higher than 100 kHz, or the low frequency side may be lower than 1 mHz. The set frequency range may be a frequency range for a "linear region da" in a "diffusion region d" shown in FIG. 12, such as a range from 0.1 Hz to 0.01 Hz. In addition, two or more different frequencies in the "diffusion region d," such as two or more frequencies between 0.1 Hz and 0.01 Hz, may be set in the set frequency range. As described above, it is obvious that the angular velocity and the frequency have a relationship of "angular velocity=2π×frequency." Accordingly, both the angular velocity and the frequency are used in the following description for convenience of description.

The measurement charging/discharging device 20 outputs, to the estimation device 30, a plurality of signals concerning a setting value of the output current, which is alternating current, and a setting value of the measurement frequency. In addition, the measurement charging/discharging device 20 switches between output and stop of the output current, which is alternating current, according to an output start signal and an output stop signal supplied from the estimation device 30.

The voltage measuring device 21 outputs, to the estimation device 30, voltage signals corresponding to alternating current voltage and direct current voltage measured between a plurality of electrodes of the battery 10.

The current measuring device 22 outputs, to the estimation device 30, current signals corresponding to alternating current and direct current measured between the measurement charging/discharging device 20 and the battery 10.

A temperature measuring device 23 configured to measure a temperature of the battery is attached to the battery 10. The temperature measuring device 23 outputs, to the estimation device 30, a temperature signal corresponding to a measured temperature of the battery 10.

The estimation device 30 is configured to estimate a charged electric charge quantity of the battery 10. The estimation device 30 may display an estimated charged electric charge quantity of the battery 10, or output this amount to the outside. For example, an external battery control device (not shown) may perform charge/discharge control of the battery 10 in accordance with a charged electric charge quantity of the battery 10 output from the estimation device 30.

The estimation device 30 acquires voltage between the plurality of terminals of the battery 10 based on a voltage signal supplied from the voltage measuring device 21, and acquires current flowing between the measurement charging/discharging device 20 and the battery 10 based on a current signal supplied from the current measuring device 22. The estimation device 30 acquires setting information and the like indicating setting of alternating current from a signal supplied from the measurement charging/discharging device 20. The estimation device 30 acquires a temperature of the battery 10 based on a temperature signal supplied from the temperature measuring device 23.

The estimation device 30 includes a processing unit 40 that performs a calculation process associated with estimation of a charged electric charge quantity of the battery 10, and a storage unit 50 configured to hold information used for a calculation process of a charged electric charge quantity of the battery 10.

The storage unit 50 is a nonvolatile storage device, such as a hard disk and a flash memory, and retains various types of data. In the first embodiment, the storage unit 50 retains correlated data 51 between a charged electric charge quantity, and a parameter necessary for calculating the charged electric charge quantity, and retains calculation data 52. For example, the calculation data 52 includes a total capacity of the battery 10.

The processing unit 40 includes a microcomputer formed by a central processing unit (CPU), a read-only memory (ROM), a random-access memory (RAM), and others. The processing unit 40 is capable of utilizing information indicating voltage, current, measurement frequency, and the like acquired by the estimation device 30. The processing unit 40 is further capable of exchanging data with the storage unit 50. For example, the processing unit 40 performs various types of processes under various types of programs retained in the ROM and the RAM and executed by the CPU.

Figure 2:
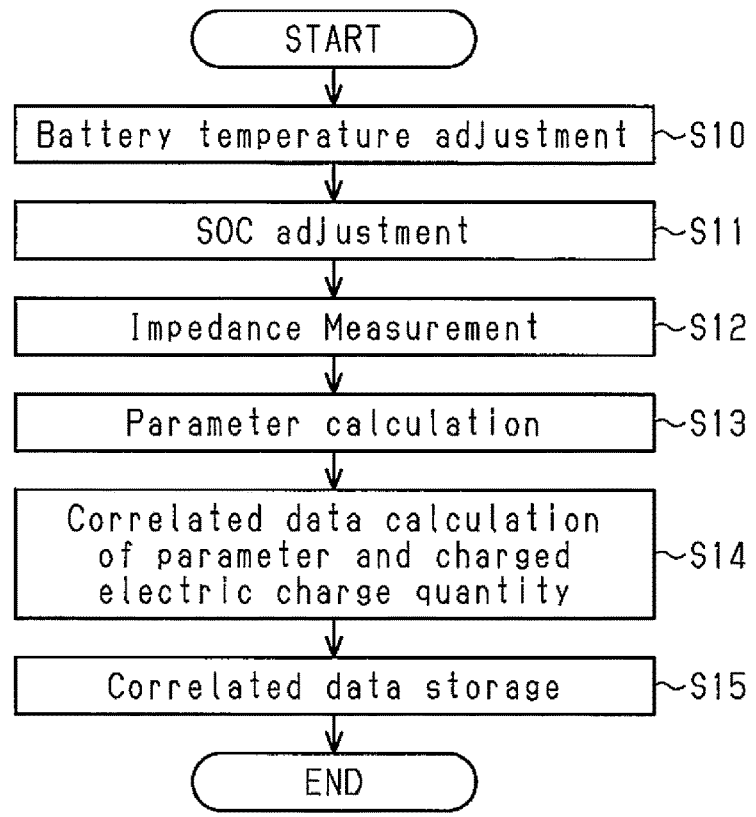
FIG. 2 is a flowchart showing the procedure for setting information showing a relationship between a charged electric charge quantity and a parameter in the first embodiment.
Figure 6:
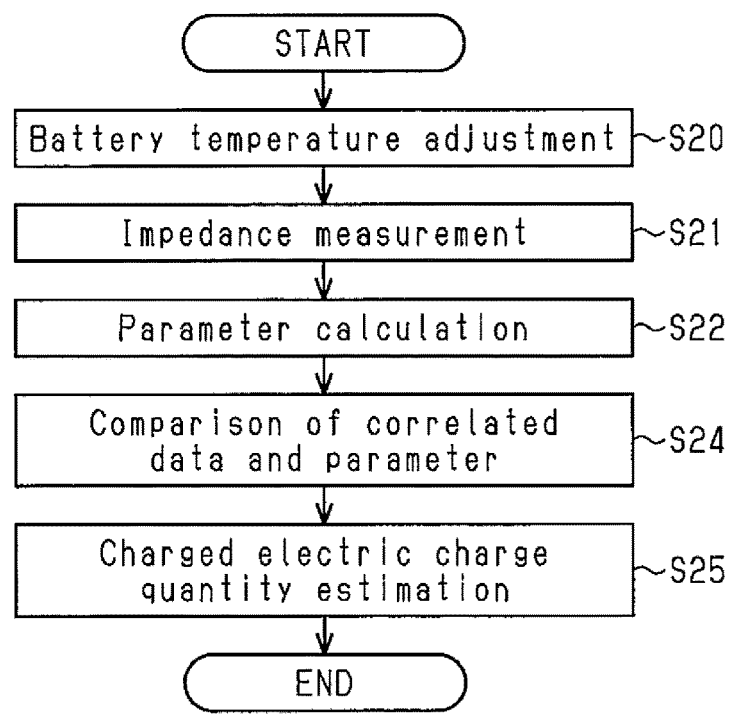
FIG. 6 is a flowchart showing the procedure for estimating a charged electric charge quantity from a complex impedance in the first embodiment.
Figure 7:
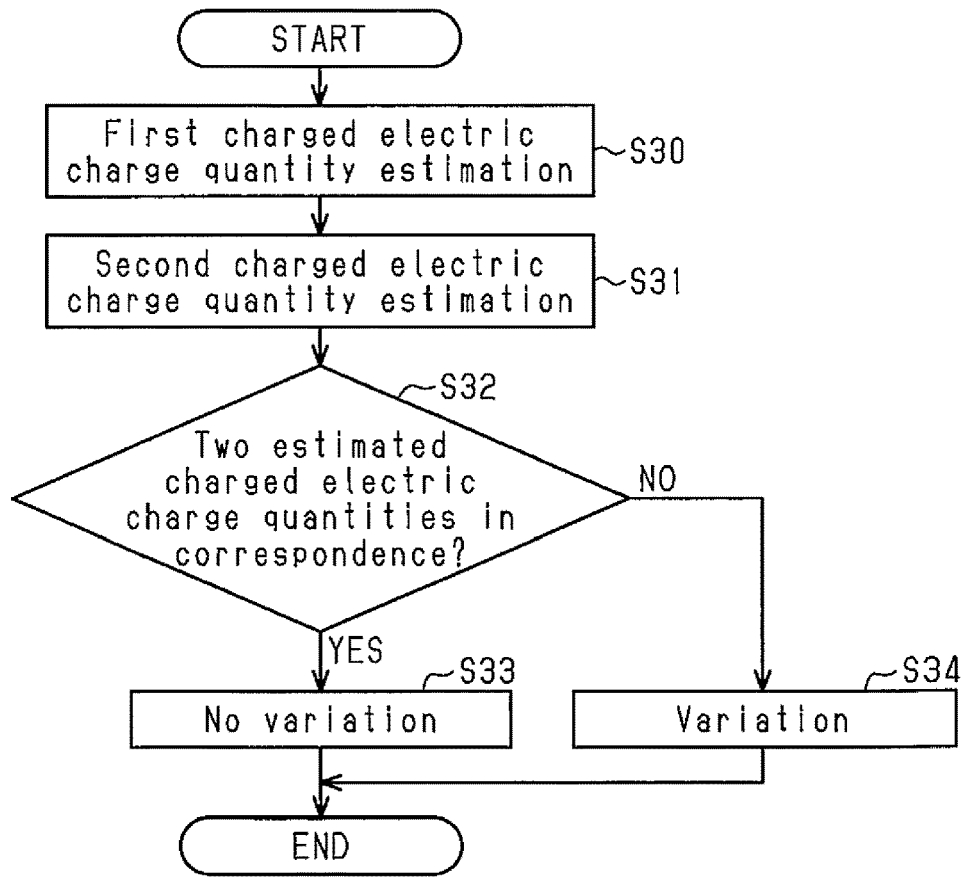
FIG. 7 is a flowchart showing the procedure for determining a variation in the charged electric charge quantity between two groups of cells forming a cell stack in the first embodiment.

In the first embodiment, the processing unit 40 is capable of acquiring the correlated data 51 indicating a correlation between a parameter and a charged electric charge quantity, and executing a process for storing the correlated data 51 in the storage unit 50 as shown in FIG. 2. Moreover, as shown in FIG. 6, the processing unit 40 is capable of executing a process for estimating a charged electric charge quantity of the battery 10 based on a complex impedance Z acquired from the battery 10. Furthermore, as shown in FIG. 7, the processing unit 40 executes a process for determining whether or not there is a variation in the SOC of the battery 10. Determination of whether or not there is a variation may be omitted.

The processing unit 40 includes an SOC adjustment unit 41 configured to adjust an SOC of the battery 10, and a temperature measurement unit 42 configured to measure a battery temperature of the battery 10. The processing unit 40 further includes an impedance measurement unit 43 configured to measure the complex impedance Z, a Nyquist diagram formation unit 44 configured to form a Nyquist diagram, a parameter calculation unit 45 configured to calculate a parameter, and an electric charge quantity calculation unit 46 configured to calculate a charged electric charge quantity. The electric charge quantity calculation unit 46 serves as an electric charge estimation unit configured to estimate the charged electric charge quantity of the battery 10.

When the processing unit 40 acquires the correlated data 51 showing a correlation between a parameter based on a complex impedance and a charged electric charge quantity, the SOC adjustment unit 41 adjusts the SOC of the battery 10 to a predetermined SOC suitable for acquiring the correlated data 51. The SOC adjustment unit 41 sequentially adjusts the battery 10 to the predetermined SOC by instructing the measurement charging/discharging device 20 to charge or discharge current. For example, the predetermined SOC includes 40%, 45%, 50%, 55%, 60%, and others. The SOC adjustment unit 41 may measure the battery 10 by a known method, or may acquire the SOC of the battery 10 from a control device or the like of the battery 10. Measurement accuracy of the SOC measured herein is maintained by increasing a measuring time of the SOC longer than a measuring time of an SOC estimated in the first embodiment.

The temperature measurement unit 42 measures a temperature of the battery 10. For example, the temperature measurement unit 42 may be attached to a housing of the battery 10 to receive a signal from a known temperature measuring unit provided inside the battery.

The impedance measurement unit 43 performs a process for measuring the complex impedance Z of the battery 10 (impedance measurement step). The impedance measurement unit 43 instructs the measurement charging/discharging device 20 to start or end measurement. The impedance measurement unit 43 measures the complex impedance Z of the battery 10 based on voltage and current acquired during a period from a start to an end of measurement. The unit of the complex impedance Z is [Ω] (ohm). The complex impedance Z is expressed by equation (1) using a real component Zr [Ω] and an imaginary component Zi [Ω], both of which are vector components of the complex impedance Z. In this equation, "j" represents an imaginary unit. The unit [Ω] will hereinafter be omitted.

$$Z = Zr - jZi \tag{1}$$

The Nyquist diagram formation unit 44 forms a Nyquist diagram from the real component Zr and the imaginary component Zi, both of which are vector components of the complex impedance Z, at each of a plurality of measurement frequencies.

Figure 3:
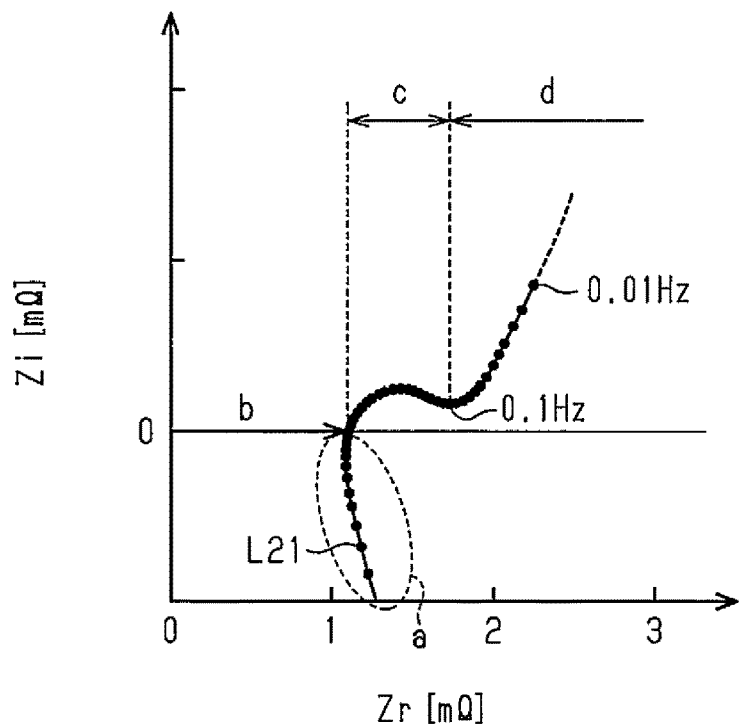
FIG. 3 is a graph showing an example of a Nyquist diagram formed from measured complex impedances of a rechargeable battery in the first embodiment.

For example, as shown in FIG. 3, the Nyquist diagram formation unit 44 forms an impedance curve L21 as a Nyquist diagram on a complex plane having a horizontal axis indicating a real number axis, and a vertical axis indicating an imaginary number axis. The impedance curve L21 is an example of a Nyquist diagram corresponding to the battery 10 in a predetermined SOC. In the impedance curve L21, magnitudes of the real component Zr and the imaginary component Zi of the complex impedance Z are plotted on the complex plane. The impedance curve L 21 is produced based on the complex impedances Z measured by changing a measuring frequency of alternating current supplied from the measurement charging/discharging device 20 to the battery 10.

In FIG. 3, each of a plurality of points of the impedance curve L21 indicates the complex impedance Z measured at corresponding one of a plurality of measurement frequencies. In FIG. 3, the measurement frequency on the lower side corresponds to the high frequency side, while the measurement frequency on the upper side corresponds to the low frequency side. The impedance curve L21 varies depending on the SOC of the battery 10 and the battery temperature. Moreover, the impedance curve L21 varies depending on the battery type, such as nickel-metal hydride rechargeable battery, lithium ion rechargeable battery, and the like. Furthermore, the impedance curve L21 varies when the number of cells, the capacity and the like are different even in case of the same battery type.

The impedance curve L21 of the battery 10 will now be described in detail with reference to FIGS. 3 and 12.

As shown in FIG. 3, the impedance curve L21 of the battery 10 is divided into a plurality of regions corresponding to the characteristics of the battery 10. The plurality of regions are classified into a "region a," "region b," "region c," and "diffusion region d" from the high frequency side to the low frequency side of the measurement frequency. The "region a" is a circuit resistance region corresponding to a circuit resistance. The "region b" is a solution resistance region corresponding to a solution resistance. The "region c" is a reaction resistance region corresponding to the complex impedance Z caused by a reaction resistance. The "diffusion region d" is a region corresponding to a substantially linear diffusion resistance. The circuit resistance is an impedance of wiring or the like formed by an active material or a contact resistance in a current collector, for example. The solution resistance is a transfer resistance of electrons, such as a resistance produced during transfer of ions in electrolytic solution filled in a separator. The response resistance is a resistance of charge transfer caused in electrode reaction, for example. The diffusion resistance is an impedance associated with material diffusion. The respective resistors mutually affect each other, wherefore it is difficult to divide the respective regions a, b, c, and d into parts each affected only by the corresponding resistance. However, a major behavior in each of the regions a, b, c, and d of the impedance curve L21 is determined by the resistance component affecting greatest. For example, the "region c" is greatly affected by a mode of a negative electrode, while the "diffusion region d" is greatly affected by a mode of a positive electrode.

Basically, the impedance curve L21 of the battery 10 is a curve produced by a combination of the impedance of the positive electrode and the impedance of the negative electrode. For example, in the frequency range corresponding to the "diffusion region d," the impedance of the positive electrode greatly changes, while the impedance of the negative electrode only slightly changes. In other words, the "diffusion region d" of the impedance curve L21 is a region greatly affected by the impedance of the positive electrode, thereby reflecting a state of the positive electrode. In contrast, in the frequency range corresponding to the "region c," the impedance of the negative electrode greatly changes, while the impedance of the positive electrode only slightly changes. In other words, the "region c" of the impedance curve L21 is a region greatly affected by the impedance of the negative electrode, thereby reflecting a state of the negative electrode.

According to the impedance curve L21 in FIG. 3, the frequency range corresponding to the "diffusion region d" is less than or equal to "0.1 Hz" and greater than "0.01 Hz." The frequency range corresponding to the "region c" is greater than "0.1 Hz" and less than or equal to "100 Hz." The frequency range corresponding to the "region b" covers "100 Hz" and frequencies around this frequency, while the frequency range corresponding to the "region a" covers frequencies higher than "100 Hz." The "diffusion region d" may be either greater than or less than "0.1 Hz" as long as the "diffusion region d" is a range lower than the "region c."

Figure 12:
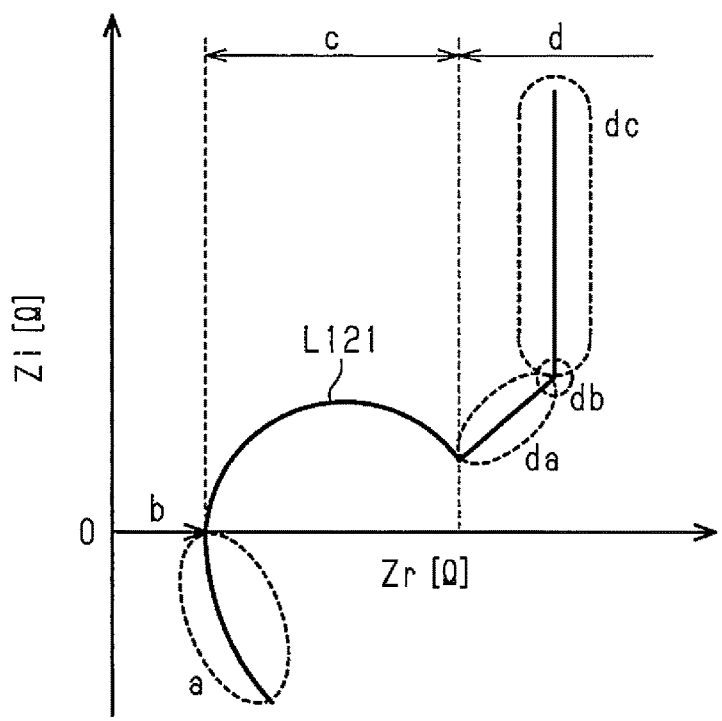
FIG. 12 is a graph showing an example of a Nyquist diagram formed based on a measured complex impedance of a rechargeable battery.

As shown in FIG. 12, the "diffusion region d" includes a "linear region da," a "vertical region dc," and a "region db." The "linear region da" is a region where a ratio of a change amount of an imaginary component to a change amount of a real component is close to "1." In other words, the "linear region da" is a range where the angle of the impedance curve is close to 45° in FIG. 12, i.e., an absolute value of a change rate of the imaginary component of the complex impedance Z to the real component ranges from 0.5 or greater to 2 or less. Therefore, there is a correlation between the imaginary component and the real component in the "linear region da." The "vertical region dc" is a region where the imaginary component greatly changes with respect to the real component, and corresponds to a region where the graph changes in a substantially vertical direction (angle of approximately 90°) in FIG. 12. The "region db" is a boundary of a change from the "linear region da" to the "vertical region dc," and a region around the boundary.

In view of characteristics and practicality of a measured value of the nickel-metal hydride rechargeable battery, measurement of the complex impedance Z of the battery 10 is generally completed in the "linear region da." A measurement frequency at which the "vertical region dc" of the nickel-metal hydride rechargeable battery is produced tends to be lower than a frequency at which the "vertical region dc" of the lithium ion rechargeable battery is produced. For more securely measuring the "vertical region dc" of the battery 10, it is necessary to adjust a measurement environment, such as a rise of the temperature of the battery, and to set the measurement frequency to a frequency much lower than "0.01 Hz" and requiring a longer time for measurement. In addition, the measurement frequency at which the "vertical region dc" is produced is not recognizable in advance. Accordingly, a dead time required for measurement may be prolonged. When estimation of a time required for measurement is difficult, measurement of a value of the "vertical region dc" for the battery 10 in use on a vehicle or the like becomes impracticable.

The parameter calculation unit 45 shown in FIG. 1 calculates a parameter (see FIG. 4) based on a ratio of a difference between measurement frequencies of two complex impedances which are contained within the "diffusion region d" and have different measurement frequencies, to a difference between components of the two complex impedances (parameter calculation step). It is assumed herein that the two complex impedances are "Z1" and "Z2." An imaginary component and a measurement frequency of the complex impedance "Z1" are "Zi1" and "f1," respectively. An imaginary component and a measurement frequency of the complex impedance "Z2" are "Zi2" and "f2," respectively.

More specifically, when measuring the two complex impedances "Z1" and "Z2" of the battery 10, the parameter calculation unit 45 calculates a difference (change amount) between measurement angular velocities of the two complex impedances "Z1" and "Z2," i.e., "Δω=2π×(f1−f2)," and a difference (change amount) between the imaginary components of the two complex impedances "Z1" and "Z2," i.e., "ΔZi=Zi1−Zi2."

Figure 4:
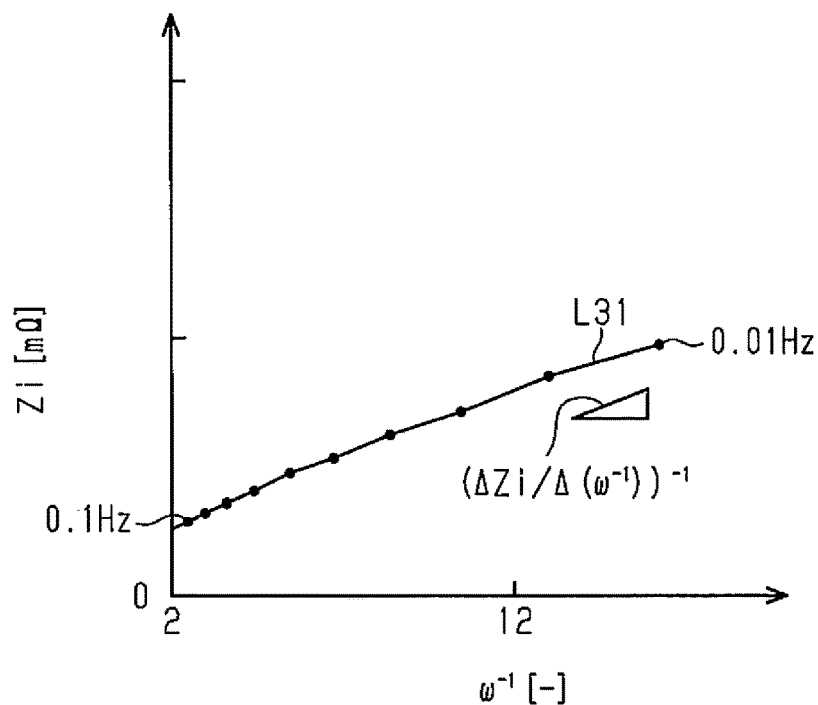
FIG. 4 is a graph showing an example of the relationship between a reciprocal of a measurement angular velocity and an imaginary component of a complex impedance in the first embodiment.

As shown in a graph L31 of FIG. 4, the parameter calculation unit 45 divides a difference "ΔZi" between the imaginary components of the two complex impedances "Z1" and "Z2" by a difference "Δ(ω$^{-1}$)" between reciprocals of the measurement angular velocities of the two complex impedances "Z1" and "Z2" to calculate a parameter "$Q_D$" as expressed by equation (2). Equation (2) represents an inclination of the difference between the imaginary components and indicates an inclination relative to the reciprocal of the difference between the measurement angular velocities. In other words, equation (2) shows that the reciprocal of the inclination (ratio) of "ΔZi" to "Δ(ω$^{-1}$)" is the parameter "$Q_D$." It is preferable to obtain the parameter "$Q_D$" as a positive value. Accordingly, absolute values of "Δ(ω$^{-1}$)" and "ΔZi" may be obtained when necessary.

$$Q_D = \left[\frac{\Delta Zi}{\Delta(\omega^{-1})}\right]^{-1} \quad (2)$$

As described above, the parameter "$Q_D$" may be calculated from equation (3) which is a deformation of equation (2). The parameter calculation unit 45 may be configured to calculate a parameter from equation (2) or (3).

$$Q_D = \left[\frac{\Delta Zi}{\Delta(\omega^{-1})}\right]^{-1} = \frac{\Delta(\omega^{-1})}{\Delta Zi} \quad (3)$$

The electric charge quantity calculation unit 46 calculates an estimated charged electric charge quantity of the battery 10 based on the correlated data 51 between a parameter indicating information preset in the storage unit 50 and a charged electric charge quantity, and on the parameter "$Q_D$" calculated by the parameter calculation unit 45 (charged electric charge quantity estimation step).

Hereinafter described with reference to FIG. 5 will be the correlated data 51 between a parameter and a charged electric charge quantity. The correlated data 51 between a parameter and a charged electric charge quantity is information indicating a relationship between the parameter "$Q_D$" within the "diffusion region d" and an SOC of the battery 10 for the complex impedance Z of the battery 10.

Figure 5:
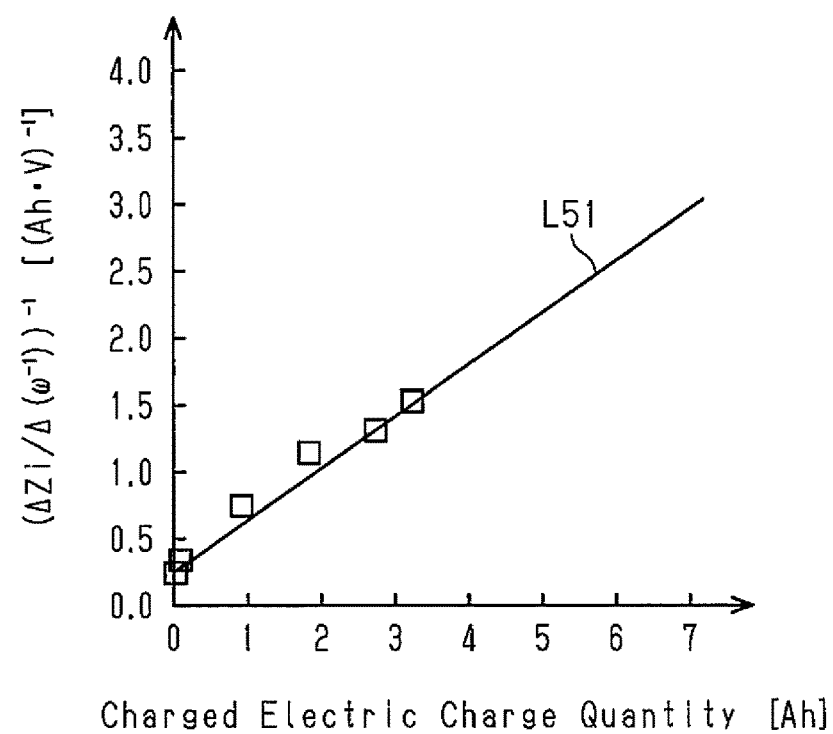
FIG. 5 is a graph showing the relationship between a parameter based on a complex impedance and a charged electric charge quantity in the first embodiment.

FIG. 5 is a graph L51 showing an example of the correlated data 51 between a parameter and a charged electric charge quantity. Specifically, the graph L51 shows a relationship between the parameter "$Q_D$" ($=(\Delta Zi/\Delta(\omega^{-1}))^{-1}$) and a charged electric charge quantity [Ah] of the battery 10. The graph L51 is formed based on the complex impedance Z measured in advance, and a charged electric charge quantity at the time of the measurement, for the battery 10 manufactured with the same specification as the specification of the battery 10 corresponding to a measurement object. The graph L51 may be formed from measured values, may be formed in consideration of theories and experiences as well as measured values, or may be information formed based on theories and experiences. The graph L51 varies according to a battery temperature, and therefore may be set for each predetermined battery temperature. More appropriate estimation of the charged electric charge quantity of the rechargeable battery is achievable by forming the graph L51 different for each predetermined battery temperature.

In other words, the correlated data 51 between the parameter retained in the storage unit 50 in FIG. 1 and the charged electric charge quantity is information indicating a relationship between the parameter "$Q_D$" associated with the complex impedance Z in the "diffusion region d" of the complex impedance Z of the battery 10, and the charged electric charge quantity of the battery 10. The correlated data 51 is preset in the storage unit 50.

With reference to FIG. 2, the procedure of processing for setting the correlated data 51 will now be described. When forming the correlated data 51, the complex impedance Z is measured for each of a plurality of different SOCs for a plurality of batteries 10 manufactured with the same specification. Accordingly, a process for setting the correlated data 51 is repeated every time the SOC is changed. Measurement of the complex impedance Z for one SOC, and setting of one item of the correlated data 51 are herein described, and acquisition of data contained in the correlated data 51 for each of a plurality of SOCs will not be described.

The processing unit 40 includes a battery temperature adjustment step (step S10 in FIG. 2), an SOC adjustment step (step S11 in FIG. 2), and an impedance measurement step (step S12 in FIG. 2). The processing unit 40 includes a parameter calculation step (step S13 in FIG. 2), a correlated data calculation step for calculating correlated data between a parameter and a charged electric charge quantity (step S14 in FIG. 2), and a correlated data storage step (step S15 in FIG. 2). A value of the correlated data is affected by a temperature and an SOC of the battery 10. Therefore, in the process for setting the correlated data 51, the battery temperature adjustment step and the SOC adjustment step are initially performed.

If setting of the correlated data 51 is started when necessary, the temperature measurement unit 42 acquires a temperature of the battery 10, and adjusts the temperature of the battery 10 to a specified temperature when necessary in the battery temperature adjustment step (step S10). For example, when the temperature of the battery 10 is appropriate, the process proceeds to a next step. When adjustment of the temperature is necessary, the temperature is adjusted.

For example, the temperature of the battery 10 is set to the specified temperature (e.g., 25° C.) by leaving the battery 10 still in an environment of 25° C. for a predetermined time. In the battery temperature adjustment step, the processing unit 40 may output a signal indicating a necessity of adjustment of the temperature of the battery 10 to allow an external temperature control device or the like to adjust an ambient temperature based on the signal.

In the SOC adjustment step (step S11), the SOC adjustment unit 41 adjusts the battery 10 to the specified SOC. The correlated data 51 is formed from the complex impedances Z in a plurality of SOCs. The SOC adjustment unit 41 is configured to sequentially change the SOC to measure the complex impedances Z in the plurality of SOCs.

In the impedance measurement step (step S12), the impedance measurement unit 43 measures the complex impedance Z of the battery 10. The Nyquist diagram formation unit 44 forms the impedance curve L21 based on the plurality of complex impedances Z measured by the impedance measurement unit 43. The Nyquist diagram formation unit 44 further specifies the "diffusion region d" of the impedance curve L21.

In the parameter calculation step (step S13), the parameter calculation unit 45 acquires the two complex impedances "Z1" and "Z2" from the "diffusion region d" specified in the impedance curve L21. For example, assume that a complex impedance at a measurement frequency of 0.1 Hz is "Z1," while a complex impedance at a measurement frequency of 0.01 Hz is "Z2." Then, the parameter "$Q_D$" is calculated by applying above-described equation (3).

In the correlated data calculation step (step S14) for calculating correlated data between a parameter and a charged electric charge quantity, the processing unit 40 forms basic data for the graph L51 based on the relationship between the parameter "$Q_D$" and the SOC. More specifically, the processing unit 40 calculates a charged electric charge quantity based on the SOC, and associates the parameter "$Q_D$" with the calculated charged electric charge quantity.

In the correlated data storage step (step S15), the storage unit 50 stores the parameter "$Q_D$" as the basic data for the graph L51 for the calculated charged electric charge quantity. For example, a plurality of parameters "$Q_D$" are set when "0 Ah," "0.1 Ah," "0.9 Ah," "1.8 Ah," "2.7 Ah," and "3.2 Ah" are obtained as the charged electric charge quantities as shown in FIG. 5.

The processing unit 40 is configured to form the graph L51 based on set data, and estimate a charged electric charge quantity of the battery 10 corresponding to the parameter "$Q_D$."

Operation

With reference to FIG. 6, a procedure for estimating a charged electric charge quantity of the battery 10 will now be described.

The processing unit 40 includes a battery temperature adjustment step (step S20 in FIG. 6), an impedance measurement step (step S21 in FIG. 6), and a parameter calculation step (step S22 in FIG. 6). The processing unit 40 further includes a comparison step for comparison between correlated data and a parameter (step S24 in FIG. 6), and a charged electric charge quantity estimation step (step S25 in FIG. 6). The battery temperature adjustment step (step S20), the impedance measurement step (step S21), and the parameter calculation step (step S22) shown in FIG. 6 are similar to the battery temperature adjustment step (step S10), the impedance measurement step (step S12), and the parameter calculation step (step S13) shown in FIG. 2, respectively. Therefore, steps similar to the steps described above will not be repeatedly described.

In the battery temperature adjustment step (step S20), the processing unit 40 adjusts the temperature of the battery 10 to a temperature suitable for estimating a charged electric charge quantity. The processing unit 40 may adjust the temperature of the battery 10, perform temperature correction for a parameter based on the acquired temperature, or select the correlated data 51 corresponding to the acquired temperature. In the impedance measurement step (step S21), the processing unit 40 measures two complex impedances. In the parameter calculation step (step S22), the processing unit 40 calculates a parameter.

In the comparison step for comparison between the correlated data and the parameter (step S24), the electric charge quantity calculation unit 46 of the processing unit 40 compares the calculated parameter with the graph L51. In the charged electric charge quantity estimation step (step S25), the electric charge quantity calculation unit 46 of the processing unit 40 acquires a charged electric charge quantity corresponding to the parameter from the compared graph L51, and estimates the acquired charged electric charge quantity as a charged electric charge quantity of the battery 10. For example, referring to FIG. 5, the charged electric charge quantity is estimated as "2 Ah" when the calculated parameter is "$Q_D=1.0$." Similarly, the charged electric charge quantity is estimated as "4 Ah," for example, when the calculated parameter is "$Q_D=1.8$." Accordingly, the processing unit 40 is configured to calculate the charged electric charge quantity of the battery 10 based on the measured complex impedance Z of the battery 10.

The processing unit 40 selects measurement frequencies of the two complex impedances from the high frequency side in the "diffusion region d." In this manner, the processing unit 40 is capable of reducing a time required for estimating the charged electric charge quantity in comparison with a case where the measurement frequencies of the two complex impedances are selected from the low frequency side such as the "vertical region dc."

Determination of the difference, or variation, in the charged electric charge quantity between the plurality of single cells forming the battery 10 based on estimation of the charged electric charge quantity will now be described. For example, the battery 10 is a cell stack formed by a plurality of battery modules or a plurality of single cells. In the first embodiment, the processing unit 40 includes a variation determination unit 48 that determines a variation. The variation determination unit 48 is capable of performing a first variation determination and a second variation determination. The variation determination unit 48 may perform only one of the first variation determination and the second variation determination.

In the first variation determination, the variation determination unit 48 determines a variation of the charged electric charge quantity between a plurality of cells forming the battery 10 based on a state that the battery 10 is fully charged. More specifically, the storage unit 50 retains in advance the calculation data 52 including a reference electric charge quantity that is an adequate charged electric charge quantity when the battery 10 is fully charged. In other words, the reference electric charge quantity is a charged electric charge quantity of the battery 10 that should be measured when each cell forming the battery 10 has an adequate charged electric charge quantity. Therefore, when an estimated charged electric charge quantity is smaller than the reference electric charge quantity, at least one of the cells forming the battery 10 has a small charged electric charge quantity. In this case, it is determined that there is a variation in the charged electric charge quantity of the plurality of cells forming the battery 10. The reference electric charge quantity is a value that may be set for each battery temperature. In addition, the reference electric charge quantity may be a value obtained based on a measurement result, or may be an experience value or a theoretical value.

A processing procedure of the first variation determination will now be described.

Initially, in the first variation determination, the processing unit 40 fully charges the battery 10. Then, the processing unit 40 estimates the charged electric charge quantity of the fully charged battery 10 in the procedure for estimating the charged electric charge quantity described above (steps S20 to S25 in FIG. 6), and compares the estimated charged electric charge quantity with the reference electric charge quantity. The processing unit 40 determines that there is no variation in the battery 10 when the estimated charged electric charge quantity falls within a predetermined range with respect to the reference electric charge quantity. When the estimated charged electric charge quantity is out of the predetermined range with respect to the reference electric charge quantity, the processing unit 40 determines that there is a variation of the battery 10. In this manner, the processing unit 40 determines whether or not there is a variation in the charged electric charge quantity in the plurality of cells forming the battery 10 based on the state that the battery 10 is fully charged.

In the second variation determination, the variation determination unit 48 divides the plurality of single cells or the plurality of battery modules of the battery 10 into two groups such that respective total capacities of the two groups can be equalized with each other, and compares the charged electric charge quantities of these two groups. The variation determination unit 48 determines whether or not there is a variation in charged electric charge quantity of the plurality of cells forming the battery 10 based on a comparison result. Described herein will be a case where a plurality of single cells forming the battery 10 are divided into a first group and a second group each formed by the same number of unit cells. Charged electric charge quantities of the two groups are compared.

More specifically, when the second variation determination is started as shown in FIG. 7, the processing unit 40 performs a first charged electric charge quantity estimation step for estimating the charged electric charge quantity of the first group (step S30). The processing unit 40 further performs a second charged electric charge quantity estimation step for estimating the charged electric charge quantity of the second group (step S31). The first and second charged electric charge quantity estimation steps are similar to the procedure for estimating a charged electric charge quantity described above (steps S20 to S25 in FIG. 6).

When the charged electric charge quantity of each of the first and second groups is estimated, the processing unit 40 compares the estimated two charged electric charge quantities, and determines whether or not a difference between the two charged electric charge quantities falls within a predetermined range (step S32). When the difference between the two charged electric charge quantities falls within the predetermined range, the processing unit 40 determines that the two charged electric charge quantities correspond to each other. When the difference between the two charged electric charge quantities is out of the predetermined range, the processing unit 40 determines that the two charged electric charge quantities do not correspond to each other. The predetermined range may be defined based on a ratio to the estimated charged electric charge quantity, or may be defined as a predetermined electric charge quantity. The condition for determining that the difference between the two charged electric charge quantities falls within the predetermined range may be a condition that the charged electric charge quantity of one of the two charged electric charge quantities is contained in a predetermined range set for the other charged electric charge quantity, or may be a condition that the other charged electric charge quantity is contained in a predetermined range set for the one charged electric charge quantity.

When it is determined that the difference between the two estimated charged electric charge quantities falls within the predetermined range (YES in step S32), the processing unit 40 determines that there is no variation in the battery 10 (step S33). When it is determined that the difference between the two estimated charged electric charge quantities is out of the predetermined range (NO in step S32), the processing unit 40 determines that there is a variation in the battery 10 (step S34). The processing unit 40 may display the determination result, or may output the determination result to the outside.

When the determination is completed, the second variation determination ends.

As described above, according to the battery state estimation device and the battery state estimation method of the first embodiment, the following effects are produced.

(1) A charged electric charge quantity of the battery 10 can be estimated based on a measurement result of the complex impedance Z. The complex impedance Z of the "diffusion region d" of the battery 10 is measured in a low frequency band of 0.1 Hz or less, for example. In this case, a relatively long time is required for measurement. However, reduction of the time required for estimating the charged electric charge quantity is achievable by limiting the measurement to only two points in the low frequency band. In other words, the frequency range within the diffusion region often lies at 0.1 Hz or less. Even when a frequency ranging from 0.1 Hz to 0.01 Hz is used for measurement, for example, measurement is achievable within a practical time range from about 10 seconds to 100 seconds.

Moreover, the complex impedance Z linearly changes. Accordingly, fewer limitations are imposed on selection of the measurement frequencies of the two complex impedances Z, and the difference between the components of the two complex impedances can be easily acquired.

The preset information may be one item of information corresponding to a model. However, the preset information may be information selected from a plurality of models set for each of temperatures of the battery 10.

In addition, the imaginary component included in the components of the two complex impedances Z within the diffusion region can be used for estimating the battery state of the battery 10. However, when there is a correlation between the imaginary component and the real component, the real component may be used for estimating the battery state of the rechargeable battery instead of the imaginary component.

(2) The variation determination unit 48 allows for the determination of whether or not there is a variation in the charged electric charge quantity of the battery 10.

(3) The variation determination unit 48 allows for the determination of whether or not there is a variation in the charged electric charge quantity of a cell stack formed by a plurality of unit cells or a plurality of battery modules.

(4) The battery state is estimated based on the imaginary components $Z_i$ of the two complex impedances Z included in the "diffusion region d." The change amount of the real component $Z_r$ of the complex impedance Z in the "diffusion region d" tends to decrease on the low frequency side. Accordingly, the freedom of selection of the measurement angular velocity of the complex impedance Z can be raised by using the imaginary component $Z_i$.

(5) The battery state of the rechargeable battery can be estimated based on a parameter that is a reciprocal of a ratio of a difference between imaginary components to a reciprocal of a difference between measurement angular velocities, and based on preset information indicating a relationship between the battery state of the battery 10 and the parameter. In addition, a reciprocal of an inclination that is linear or substantially linear can be obtained by using a reciprocal of a difference between measurement angular velocities as a difference between measurement angular velocities of the two complex impedances Z.

(6) The "linear region da" of each of the two complex impedances Z in the "diffusion region d" lies in a range where a change rate of the imaginary component $Z_i$ with respect to the real component $Z_r$ is close to "1." Accordingly, the real component $Z_r$ may be used instead of the imaginary component $Z_i$.

(7) In case of a nickel-metal hydride rechargeable battery, there is no proportional relationship between voltage and an SOC. In this case, estimation of a battery state such as a charged electric charge quantity based on voltage is difficult. According to the first embodiment, however, a battery state is estimated based on a change in the component of the complex impedance Z within the "diffusion region d." Accordingly, even in the case of the nickel-metal hydride rechargeable battery, the battery state can be appropriately estimated.

Second Embodiment

A battery state estimation device and a battery state estimation method according to a second embodiment will be described with reference to FIGS. 8 to 11. The second embodiment differs from the first embodiment in that a temperature of the battery 10, which is regarded as one of battery states, is estimated based on a parameter calculated from a complex impedance of the battery 10. Differences will hereinafter be chiefly described. Similar configurations are given similar reference numerals for convenience of description, and these configurations will not be described in detail.

Figure 8:
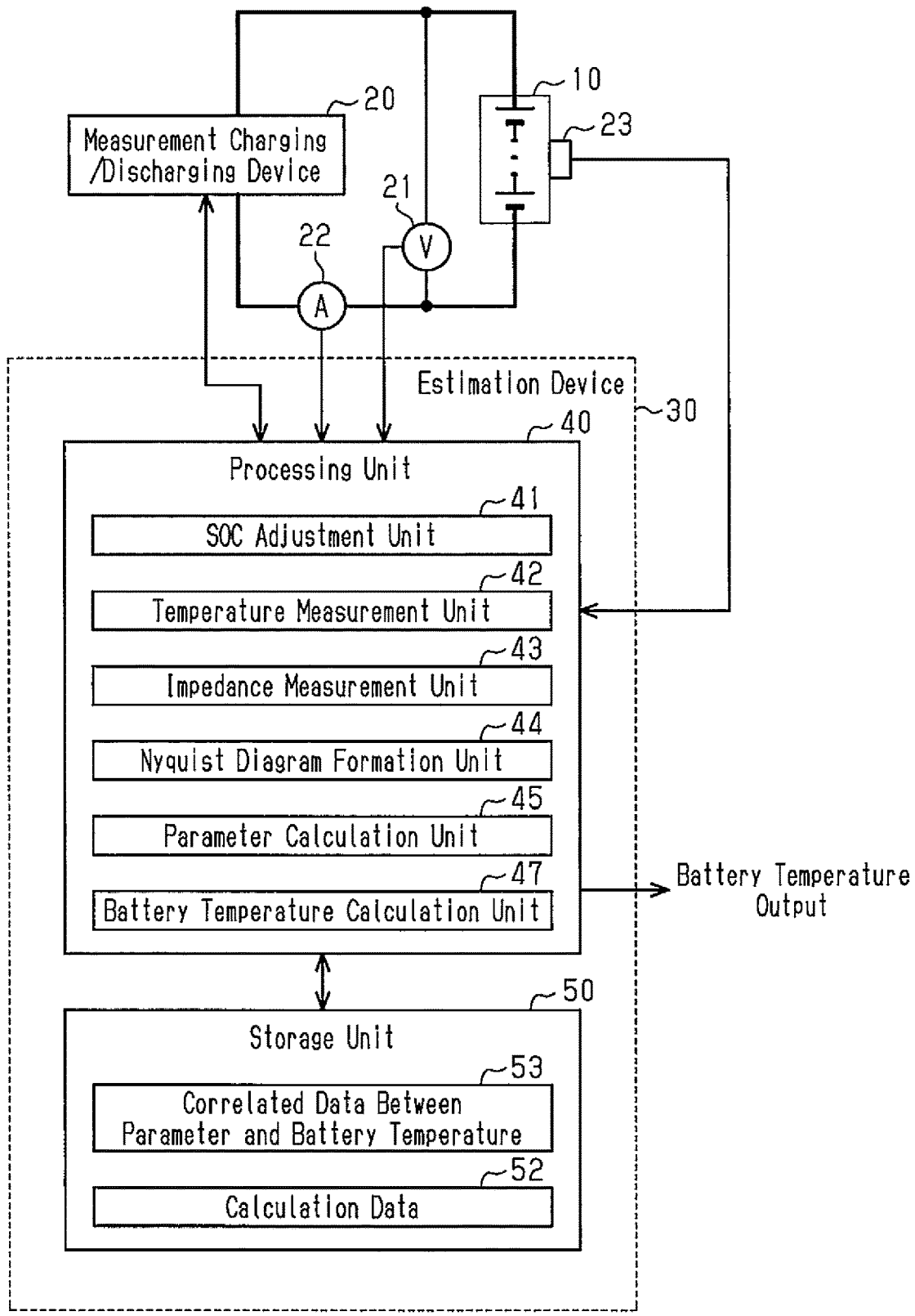
FIG. 8 is a block diagram showing a schematic configuration of a battery state estimation device according to a second embodiment.

As shown in FIG. 8, the measurement circuit 5 that measures a state of the battery 10 is similar to the measurement circuit 5 of the first embodiment. More specifically, the measurement circuit 5 includes the battery 10, the measurement charging/discharging device 20 and the voltage measuring device 21 connected between the plurality of terminals of the battery 10, and the current measuring device 22 connected between the measurement charging/discharging device 20 and the battery 10. The temperature measuring device 23 that measures a temperature of the battery 10 is attached to the battery 10.

The estimation device 30 acquires a voltage signal from the voltage measuring device 21, acquires a current signal from the current measuring device 22, acquires setting information and the like indicating setting of alternating current from the measurement charging/discharging device 20, and acquires a temperature signal from the temperature measuring device 23. The estimation device 30 further includes the processing unit 40 and the storage unit 50.

The storage unit 50 retains the correlated data 53 between a parameter and a charged electric charge quantity, and the calculation data 52, which are required for calculating the temperature of the battery. The correlated data 53 includes correlated data between a parameter and a charged electric charge quantity for each temperature of the battery 10.

Figure 9:
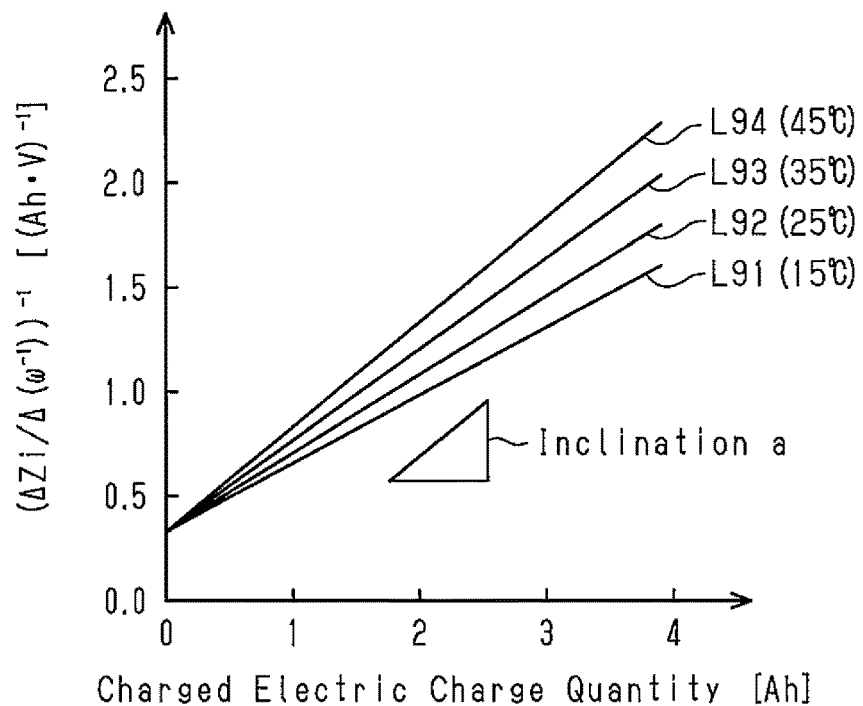
FIG. 9 is a graph showing the relationship between a parameter based on a complex impedance and a charged electric charge quantity for each battery temperature in the second embodiment.

As shown in FIG. 9, the correlated data 53 includes information corresponding to graphs L91 to L94 each indicating a relationship between a parameter and a charged electric charge quantity for each temperature of the battery 10.

The processing unit 40 includes the SOC adjustment unit 41, the temperature measurement unit 42, the impedance measurement unit 43, the Nyquist diagram formation unit 44, the parameter calculation unit 45, and a battery temperature calculation unit 47.

The battery temperature calculation unit 47 calculates an estimated battery temperature of the battery 10 based on the correlated data 53 between a parameter and a charged electric charge quantity for each temperature of the battery 10 set in the storage unit 50, and the parameter "$Q_D$" calculated by the parameter calculation unit 45 (temperature estimation step).

As shown in FIG. 9, the correlated data 53 is formed by the correlated data 51 between a charged electric charge quantity and each of parameters when the battery 10 has temperatures of 15° C., 25° C., 35° C., and 45° C., for example. In one example, the graph L91 is the correlated data 51 when the battery temperature is 15° C., the graph L92 is the correlated data 51 when the battery temperature is 25° C., the graph L93 is the correlated data 51 when the battery temperature is 35° C., and the graph L94 is correlated data 51 when the battery temperature is 45° C. For example, regardless of the charged electric charge quantity, the parameter of the battery 10 has an inclination shown in the graph L91 when the temperature is 15° C., an inclination shown in the graph L92 when the temperature is 25° C., an inclination shown in the graph L93 when the temperature is 35° C., and an inclination shown in the graph L94 when the temperature is 45° C.

Accordingly, in one example, the temperature of the battery 10 may be estimated based on inclinations of two parameters acquired at different charged electric charge quantities, and the inclinations of the respective graphs L91 to L94 shown in FIG. 9 under a condition of no temperature change.

In the second embodiment, the estimated temperature of the battery 10 is acquired based on a position shown on the graph of FIG. 9 and specified from the calculated one parameter and the charged electric charge quantity of the battery 10 at the time of calculation of the parameter, and based on comparison between the graph L91 to L94 included in the correlated data 53. In other words, the processing unit 40 estimates the temperature of the battery 10 based on the parameter and the charged electric charge quantity.

Figure 10:
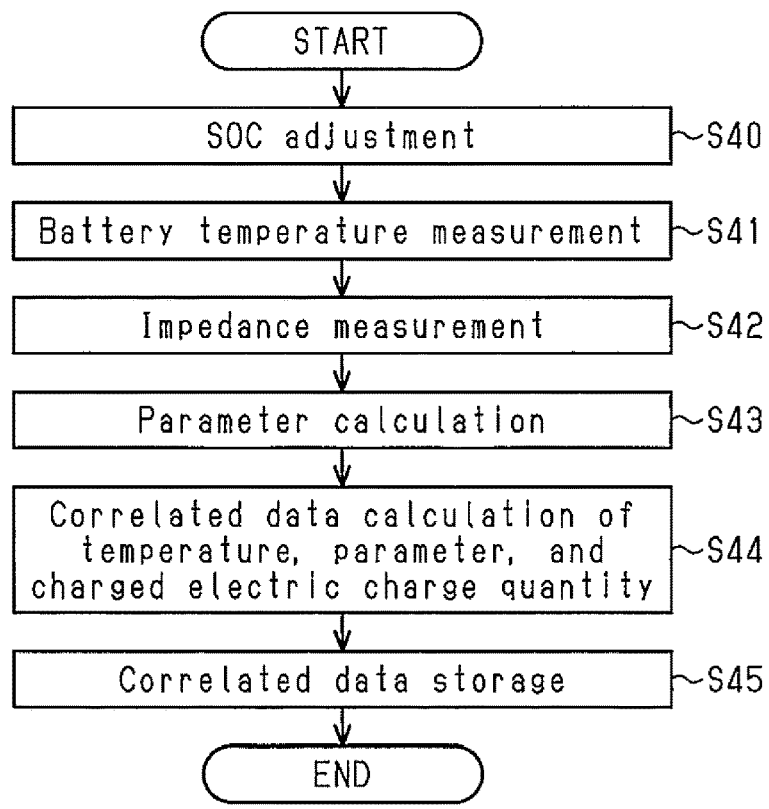
FIG. 10 is a flowchart showing the procedure for setting information showing a relationship between a battery temperature and a parameter in the second embodiment.
Figure 11:
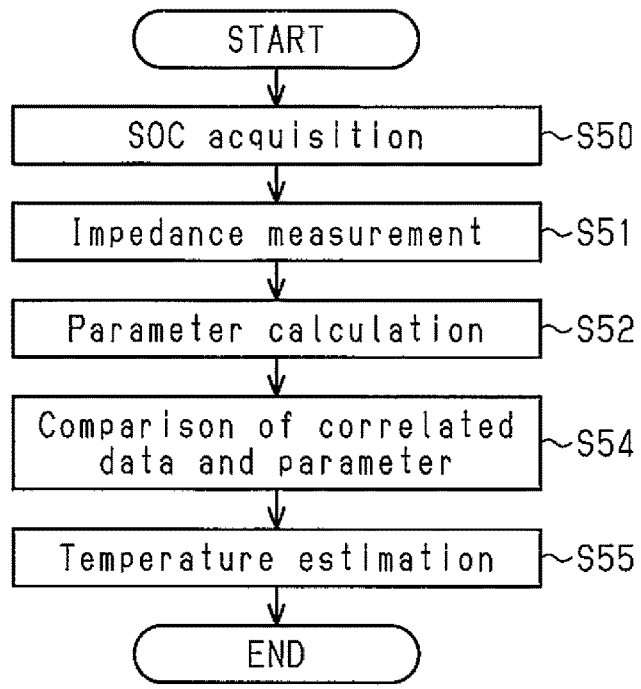
FIG. 11 is a flowchart showing the procedure for estimating a battery temperature from a parameter based on a complex impedance in the second embodiment.

With reference to FIGS. 10 and 11, the setting of the correlated data 53 for estimating the battery temperature and estimation of the battery temperature using the correlated data 53 will now be described.

The processing unit 40 is capable of acquiring the correlated data 53 indicating a relationship between a parameter for each temperature and a charged electric charge quantity, and executing a process for storing the correlated data 53 in the storage unit 50 as shown in FIG. 10. Moreover, as shown in FIG. 11, the processing unit 40 is capable of executing a process for estimating the temperature of the battery 10 based on the complex impedance Z acquired from the battery 10.

With reference to FIG. 10, a procedure for setting the correlated data 53 will first be described.

The processing unit 40 includes an SOC adjustment step (step S40), a battery temperature measurement step (step S41), an impedance measurement step (step S42), and a parameter calculation step (step S43). The processing unit 40 further includes a step for calculating correlated data between a parameter and a charged electric charge quantity for each temperature (step S44), and a correlated data storage step (step S45). The impedance measurement step (step S42) and the parameter calculation step (step S43) are similar to the impedance measurement step (step S12 in FIG. 2) and the parameter calculation step (step S13 in FIG. 2) of the first embodiment, wherefore the same description will not be repeated.

As shown in FIG. 10, the SOC adjustment unit 41 acquires an SOC of the battery 10, and adjusts the SOC of the battery 10 when necessary in the SOC adjustment step (step S40).

The temperature measurement unit 42 acquires a current temperature of the battery 10 with high accuracy in the battery temperature measurement step (step S41). For example, the temperature measurement unit 42 acquires a surface temperature of the battery 10 left still with the plurality of terminals open for a predetermined period at a predetermined ambient temperature. An inside temperature of the battery 10 left still in this manner, such as a temperature of an electrode plate, is also close to the surface temperature of the battery 10. Accordingly, the inside temperature of the battery that greatly affects battery characteristics can be acquired with high accuracy.

The processing unit 40 measures two complex impedances in the impedance measurement step (step S42), and calculates a parameter in the parameter calculation step (step S43). The processing unit 40 calculates correlated data between the battery temperature, the parameter "$Q_D$," and the charged electric charge quantity (step S44), and stores, in the storage unit 50, the calculated parameter "$Q_D$" for the charged electric charge quantity for each temperature as data corresponding to the graphs L91 to L94 (step S45).

When the charged electric charge quantity (SOC) of the battery 10 is known, the processing unit 40 is configured to estimate the temperature of the battery 10 from the parameter "$Q_D$" based on the graphs L91 to L94 formed from data calculated in the manner described above.

A procedure for estimating the temperature of the battery 10 will now be described with reference to FIG. 11.

The processing unit 40 includes an SOC acquisition step (step S50), an impedance measurement step (step S51), and a parameter calculation step (step S52). The processing unit 40 further includes a comparison step for comparing correlated data and a parameter (step S54), and a temperature estimation step (step S55). The impedance measurement step (step S51) and the parameter calculation step (step S52) are similar to the impedance measurement step (step S12 in FIG. 2) and the parameter calculation step (step S13 in FIG. 2) of the first embodiment, wherefore the same description will not be repeated.

The processing unit 40 acquires a current SOC of the battery 10 by using a known technology in the SOC acquisition step (step S50). The SOC adjustment unit 41 of the processing unit 40 may measure the SOC of the battery 10, or the SOC of the battery 10 may be set or input to the processing unit 40 from the outside. The charged electric charge quantity obtained by converting the SOC acquired herein is applied to comparison with the correlated data 53 (see FIG. 9) between the parameter for each battery temperature and the charged electric charge quantity. The processing unit 40 may acquire the charged electric charge quantity instead of the SOC.

After measuring the two complex impedances in the impedance measurement step (step S51), the processing unit 40 calculates a parameter in the parameter calculation step (step S52).

The processing unit 40 causes the battery temperature calculation unit 47 to specify corresponding one of the graphs L91 to L94 by comparing the charged electric charge quantity and the calculated parameter with the graphs L91 to L94 (comparison step between correlated data and parameter (step S54)). The processing unit 40 acquires a corresponding temperature of the specified graphs L91 to L94, and estimates the acquired temperature as the temperature of the battery 10 (temperature estimation step (step S55)). For example, referring to FIG. 9, it is estimated that the battery temperature is "15° C." based on the parameter of "$Q_D$=1.0" and the charged electric charge quantity of "2 Ah." Similarly, for example, it is estimated that the battery temperature is "35° C." based on the parameter of "$Q_D$=1.6" and the charged electric charge quantity of "3 Ah." In this manner, the processing unit 40 is configured to estimate the temperature of the battery 10 based on the complex impedance Z and the SOC (charged electric charge quantity) measured from the battery 10.

As described above, according to the battery state estimation device and the battery state estimation method of the second embodiment, the following effects are produced in addition to the effects (1) to (7) described in the first embodiment.

(8) A temperature of the battery 10 can be estimated based on a measurement result of the complex impedance Z. The complex impedance Z of the "diffusion region d" of the battery 10 is measured in a low frequency band of 0.1 Hz or less, for example. In this case, a relatively long time is required for measurement. However, reduction of the time required for estimating the temperature of the battery is achievable by limiting the measurement to only two points in the low frequency band.

Generally, the temperature of the battery 10 is measured on the surface of the battery 10. In this case, a temperature of an electrode plate group that greatly affects charging and discharging is impossible to acquire. According to this configuration, however, the temperature of the electrode plate group is estimated as the temperature of the battery 10 based on a state of a portion of a current flow in the electrode plate group. Therefore, the temperature of the battery 10 can be acquired with high accuracy.

Third Embodiment

A battery state estimation device and a battery state estimation method according to a third embodiment will be described with reference to FIGS. 13A to 13C. The third embodiment is different from the first and second embodiments in that the measurement charging/discharging device 20 supplies step current for impedance measurement to the battery 10 to measure a complex impedance of the battery 10. Differences will hereinafter be chiefly described. Similar configurations are given similar reference numerals for convenience of description, and these configurations will not be described in detail.

The measurement charging/discharging device 20 is capable of supplying step current for impedance measurement to the battery 10. The step current forms direct current for measurement. The measurement charging/discharging device 20 generates step current having a predetermined cycle, and outputs the generated step current between the terminals of the battery 10. Moreover, the measurement charging/discharging device 20 is capable of changing a cycle of step current when necessary. The measurement charging/discharging device 20 sets a cycle of step current, and outputs the step current having the set cycle. The cycle herein includes a set of on-period and off-period, and a set of positive polarity period and negative polarity period. The step current is repeatedly output in one cycle or a plurality of cycles. The period of the cycle is set to a specific frequency in a range from 0.1 Hz to 1 mHz, for example. An impedance at a frequency of "(2×n−1) times" (n: natural number) higher than the set cycle is measurable.

Figure 13A:
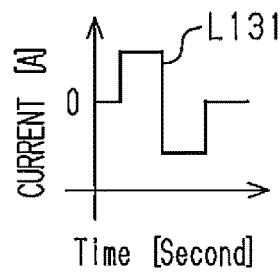
FIGS. 13A to 13C are each a graph or a diagram showing a schematic configuration of a battery state estimation device according to a third embodiment, where

As shown in FIG. 13A, the measurement charging/discharging device 20 applies step current having a predetermined cycle (see graph L131) to the battery 10 corresponding to a measurement target. The number of times of the cycle may be either one or more. In this case, the battery 10 corresponding to a measurement target outputs response voltage (see graph L132) corresponding to the step current having the predetermined cycle (see graph L131). The processing unit 40 performs Fourier transform for the step current (see graph L131) and the response voltage (see the graph L132).

Figure 13B:
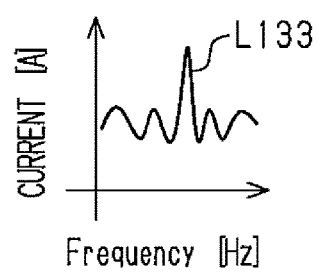

As shown in FIG. 13B, the processing unit 40 calculates a current frequency response (see graph L133) calculated from the step current (see graph L131) by Fourier transform, and a voltage frequency response (see graph L134) calculated from response voltage (see graph L132) by Fourier transform. In other words, an angular velocity corresponding to a sine wave is determined as a measurement angular velocity. Therefore, in the third embodiment, a frequency (angular velocity) characteristic corresponding to the sine wave is obtained by Fourier transform of the step current and the response voltage. The obtained frequency (angular velocity) is regarded as a measurement angular velocity. A Nyquist diagram of a complex impedance is formed based on the measurement angular velocity. More specifically, the measurement charging/discharging device 20 changes direct current power the supplied to the rechargeable battery (10), that is, the current value or the voltage value. The processing unit 40 acquires a transient response of the direct current power thus changed, and calculates the measurement angular velocity of the complex impedance based on the frequency response transformed from the transient response of the acquired direct current power.

Figure 13C:
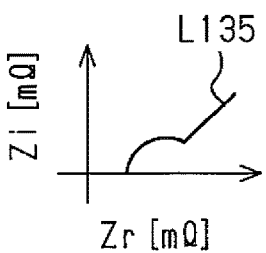
Figure 13C:
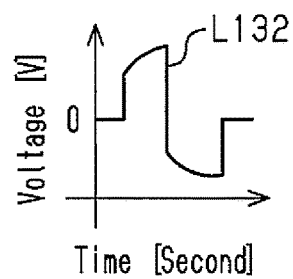

As shown in FIG. 13C, the processing unit 40 calculates a complex impedance based on the current frequency response (see the graph L133) and the voltage frequency response (see the graph L134), and forms a Nyquist diagram of the calculated complex impedance (see graph L135). In other words, by analyzing the transient response of the step response, the processing unit 40 measures the impedance such that the angular velocity corresponding to the sine wave becomes the measurement angular velocity. For example, the impedance at each frequency is obtained from Ohm's law "Z (resistance)=V (voltage)/I (current)" based on the current frequency response and the voltage frequency response.

The cycle of the step current is set such that the "diffusion region d," more preferably, the "linear region da" of the "diffusion region d," is contained in the impedance measured from the battery 10.

The processing unit 40 is capable of estimating a charged electric charge quantity of the battery 10 by comparing the calculated impedance with information indicating the relationship between the parameter "$Q_D$" associated with the complex impedance Z and the charged electric charge quantity.

The processing unit 40 also estimates the calculated impedance and a temperature of the battery 10 from the parameter "$Q_D$" based on a condition that the charged electric charge quantity (SOC) of the battery 10 is known.

As described above, according to the battery state estimation device and the battery state estimation method of the third embodiment, the following effects are produced in addition to the effects (1) to (8) described in the first embodiment.

(9) An impedance of the battery 10 can also be calculated by inputting step current to the battery 10.

Other Embodiments

The respective embodiments described above may be practiced in the following modes.

The embodiments described above may be combined with one another as long as there are no technical contradictions.

In the third embodiment, a load response of the battery 10 for each period of the cycle of the step current is associated with a load response of the battery 10 for each frequency of alternating current. The processing unit 40 may acquire the load response corresponding to alternating current by applying, to this association, the load response to the step current of the battery 10. In this case, a volume of calculation such as Fourier transform can be reduced.

Figure 14:
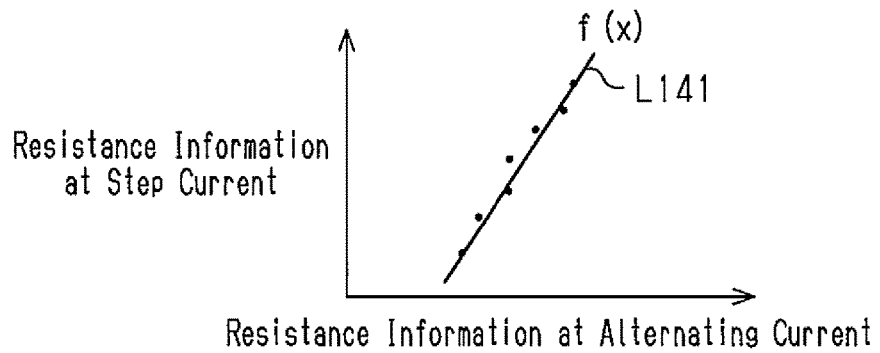
FIG. 14 is a diagram showing the relationship between measurement results of measurement current voltage and alternating current voltage obtained by a battery state estimation device according to another embodiment.

For example, as shown in FIG. 14, a relationship between resistance information about resistance to step current and resistance information about resistance to alternating current is preset as a graph L141 and a function $f(x)$. The processing unit 40 can acquire a load response to step current of the battery, and obtain a load response or the like to alternating current corresponding to the acquired load response. The resistance information about resistance to step current includes a step cycle, a current value, and a voltage value, while the resistance information about resistance to alternating current includes an alternating current frequency, a current value, a voltage value, and an impedance.

The third embodiment exemplifies a case in which one cycle within the range from 0.1 Hz to 1 mHz is defined as a set cycle. However, the present invention is not limited to this example. The cycle may be higher than 0.1 Hz or less than 1 mHz as long as the impedance allowed to be measured in the set cycle includes the "diffusion region d."

The third embodiment exemplifies a case in which an impedance is calculated by analyzing a transient response of the battery 10 to step current having a cycle. However, the present invention is not limited to this example. The processing unit 40 may calculate an impedance by analyzing one or more transient responses at a rise of the step current, or one or more transient responses at a drop of the step current. For example, when a cycle length of the step current is equal to or longer than a convergence time of the transient response, application of the step current may be regarded as application of direct current. Conversely, when the cycle length of the step current is sufficiently shorter than the convergence time of the transient response, application of the step current may be regarded as application of alternating current.

The third embodiment exemplifies a case in which step current is applied to measure a voltage response. The present invention is not limited to this example. Step voltage may be applied to measure a current response. In either of the cases, the processing unit 40 is capable of measuring an impedance.

The first and second embodiments exemplify cases in which sinusoidal alternating current is applied. The third embodiment exemplifies a case in which step current is applied. However, the present invention is not limited to this example. Current or the like having a triangular waveform or other waveforms may be applied as long as a transient response of the battery can be obtained.

The first to third embodiments exemplify cases in which the battery 10 is connected to the measurement circuit. However, the present invention is not limited to this example. The battery may be connected to a load, a charger or the like via a not-shown switch or the like, instead of the measurement circuit. For example, when the battery is an in-vehicle battery, the processing unit 40 is allowed to estimate the battery state of the battery by measuring a complex impedance when necessary while utilizing the battery as a power source for driving.

The first to third embodiments exemplify cases in which the battery 10 is a nickel-metal hydride rechargeable battery. However, the present invention is not limited to this example. An alkaline rechargeable battery such as a nickel cadmium battery, or a lithium ion rechargeable battery may form a rechargeable battery, for example.

The first to third embodiments exemplify cases in which a parameter is calculated using the imaginary component Zi included in the components of the complex impedance Z. However, the present invention is not limited to this example. The processing unit 40 may calculate the parameter $Q_D$ using the real component Zr included in the components of the complex impedance Z. In this case, a charged electric charge quantity can also be estimated by setting correlated data based on a parameter set using the real component Zr. Moreover, a temperature of the battery can be estimated by preparing beforehand correlated data corresponding to this parameter and indicating a relationship between a charged electric charge quantity and the parameter for each battery temperature. For example, the change rate of the imaginary component Zi with respect to the real component Zr lies in a range close to "1" in the "linear region da." Accordingly, even when the real component Zr is used in place of the imaginary component Zi, the charged electric charge quantity and the battery temperature can be estimated from the complex impedance Z of the battery 10.

The first embodiment exemplifies a case in which unit cells forming the battery 10 are divided into a plurality of groups when performing the second variation determination. In this case, some of the unit cells or the battery modules forming the battery may be divided into a plurality of groups. In this manner, inspections can be performed through sampling.

Some of the unit cells or the like may be included in same groups. In this manner, cells or the like with a large difference in the charged electric charge quantity can be narrowed down.

The first embodiment exemplifies a case in which each of the two groups has the same total capacity in the second variation determination. However, the present invention is not limited to this example. The two groups may have different total capacities as long as the difference between the total capacities of the two groups can be corrected.

The first embodiment exemplifies a case in which the plurality of unit cells forming the battery 10 are divided into two groups when performing the second variation determination. However, the present invention is not limited to this example. The unit cells or the like may be divided into three or more groups to compare the respective groups.

The first embodiment exemplifies a case in which the variation determination unit 48 performs variation determination of the charged electric charge quantity for the respective cells forming the battery 10 based on the state that the battery 10 is fully charged in the first variation determination. However, the present invention is not limited to this example. The first variation determination may be performed based on a state that the battery is in a predetermined SOC. In this case, the state that the battery is in the predetermined SOC may be estimated by a known technology.

The first embodiment exemplifies a case in which the variation determination unit 48 is provided. However, the present invention is not limited to this example. The variation determination unit may be eliminated as long as variation determination is unnecessary.

The first embodiment exemplifies a case in which the temperature of the battery 10 is set to the predetermined temperature. However, the present invention is not limited to this example. As shown in FIG. 9, the charged electric charge quantity may be acquired, based on correlated data corresponding to the temperature of the battery, by preparing the correlated data for each battery temperature, and acquiring the temperature of the battery. In this manner, the charged electric charge quantity can be estimated with high accuracy in consideration of the temperature of the battery.

The first to third embodiments exemplify cases in which the parameter "$Q_D$" is calculated from equations (2) and (3). However, the present invention is not limited to this example. The form of equation is not limited to equations (2) and (3) as long as the theory expressed in equation (2) can be expressed.

The first to third embodiments exemplify cases in which the two complex impedances Z are contained in the "linear region da" of the "diffusion region d." However, the present invention is not limited to this example. One of the two complex impedances may lie in the region such as the "region db" or the "vertical region dc" of the "diffusion region d" as long as a difference between measurement angular velocities of the two complex impedances and a difference between imaginary components of the two complex impedances can be obtained. In this manner, reduction of the time required for acquiring the complex impedances is also achievable by the other complex impedance contained in the "linear region da."

The first to third embodiments exemplify cases in which a parameter having a linear shape or substantially a linear shape is obtained by using a reciprocal of a difference between measurement angular velocities of two complex impedances as a difference between the measurement angular velocities. However, the present invention is not limited to this example. The difference between the measurement angular velocities of the two complex impedances may be used as the difference between the measurement angular velocities without change. In this case, a parameter having no linear shape is obtained. However, a correlation between the obtained parameter and the battery state can be acquired.

The first to third embodiments exemplify cases in which the battery 10 is mounted on an electric vehicle or a hybrid vehicle. However, the present invention is not limited to this example. The battery may be mounted on a vehicle such as a gasoline car or a diesel car. In addition, the battery may be used as a power supply for a moving object such as a railroad, a ship, an airplane and a robot, or for fixed installation such as an electric product including information processing device.

In the above embodiments, the processing unit 40 (SOC adjustment unit 41, temperature measurement unit 42, impedance measurement unit 43, Nyquist diagram formation unit 44, parameter calculation unit 45, electric charge quantity calculation unit 46) may be formed by one or more dedicated circuits or one or more processors. For example, the processing unit 40 may include one or more processors, and a memory that stores one or more programs including a command group executable by the one or more processors (computer readable non-transitory storage medium). When executed, the command group causes the corresponding processor to perform operation of the estimation device 30 of the present disclosure. For example, the corresponding program includes a command group that causes the corresponding processor to execute processing corresponding to the processing unit 40 in the sequences S10 to S15 shown in FIG. 2, sequences S20 to S25 shown in FIG. 6, or sequences S30 to S34 shown in FIG. 7. According to the present disclosure, therefore, a computer readable non-transitory storage medium storing the foregoing programs is also provided.

The invention claimed is:

1. A battery state estimation device for estimating a charged electric charge quantity of a rechargeable battery, the battery state estimation device comprising:
   an impedance measurement unit configured to measure a plurality of complex impedances of the rechargeable battery by supplying measurement power to the rechargeable battery;
   a parameter calculation unit configured to calculate a parameter that includes a ratio of a difference between measurement angular velocities of two complex impedances in a diffusion region among the measured complex impedances to a difference between components of the two complex impedances; and
   an electric charge quantity estimation unit configured to estimate a charged electric charge quantity of the rechargeable battery based on the calculated parameter and preset correlated information between the charged electric charge quantity of the rechargeable battery and the parameter.

2. The battery state estimation device according to claim 1, wherein the measurement power is direct current power or alternating current power.

3. The battery state estimation device according to claim 2, wherein when the measurement power is direct current power, the direct current power supplied to the rechargeable battery is changed to acquire the measurement angular velocities of the two complex impedances based on a frequency response converted from a transient response of the direct current power.

4. The battery state estimation device according to claim 1, further comprising a temperature acquisition unit configured to acquire a temperature of the rechargeable battery, wherein:
   the correlated information is one of multiple items of correlated information;
   each of the items of correlated information indicates correlated information between the parameter and a charged electric charge quantity of the rechargeable battery at a corresponding temperature among a plurality of temperatures of the rechargeable battery; and
the estimation of the charged electric charge quantity of the rechargeable battery includes
selection of correlated information corresponding to a temperature acquired from the items of correlated information, and
application of the calculated parameter to the selected correlated information to estimate the charged electric charge quantity of the rechargeable battery.

5. The battery state estimation device according to claim 1, further comprising:
a storage unit configured to store the correlated information and a reference electric charge quantity that is an adequate charged electric charge quantity when the rechargeable battery is fully charged; and
a first variation determination unit configured to compare an estimated charged electric charge quantity of the rechargeable battery with the reference electric charge quantity when the rechargeable battery is fully charged to determine whether or not there is a variation in the charged electric charge quantity of the rechargeable battery.

6. The battery state estimation device according to claim 1, wherein:
the rechargeable battery is a cell stack including a plurality of cells;
the estimation of the charged electric charge quantity of the rechargeable battery includes estimating charged electric charge quantities of two groups that are divided so that at least some of the cells in the cell stack are not included in both of the two groups; and
the battery state estimation device further comprises a second variation determination unit configured to compare estimated charged electric charge quantities of the two groups and determine whether or not there is a variation in the charged electric charge quantity between the cells in the cell stack based on the comparison.

7. The battery state estimation device according to claim 1, wherein each of the two complex impedances includes a component that is an imaginary component of a complex impedance.

8. The battery state estimation device according to claim 7, wherein the parameter calculation unit calculates the parameter from the equation of $$Q_D = \left[\frac{\Delta Zi}{\Delta(\omega^{-1})}\right]^{-1}$$

where a reciprocal of a difference between the measurement angular velocities of the two complex impedances is represented by "$\Delta(\omega^{-1})$," a difference between the imaginary components of the two complex impedances is represented by "$\Delta Zi$," and the parameter is represented by "$Q_D$".

9. The battery state estimation device according to claim 1, wherein the measurement angular velocities of the two complex impedances are angular velocities in which absolute values of change rates of imaginary components of the two complex impedances with respect to real components lie in a range from 0.5 or greater to 2 or less.

10. The battery state estimation device according to claim 1, wherein the rechargeable battery is a nickel-metal hydride rechargeable battery.

11. A battery state estimation device for estimating a temperature of a rechargeable battery, the battery state estimation device comprising:
an electric charge quantity acquisition unit configured to acquire a charged electric charge quantity of the rechargeable battery;
an impedance measurement unit configured to measure a plurality of complex impedances of the rechargeable battery by supplying measurement power to the rechargeable battery;
a parameter calculation unit configured to calculate a parameter that includes a ratio of a difference between measurement angular velocities of two complex impedances in a diffusion region among the measured complex impedances to a difference between components of the two complex impedances; and
a temperature estimation unit configured to estimate a temperature of the rechargeable battery by applying the acquired charged electric charge quantity and the calculated parameter to preset information indicating a relationship between the parameter for the charged electric charge quantity of the rechargeable battery and the temperature of the rechargeable battery.

12. A battery state estimation method for estimating a charged electric charge quantity of a rechargeable battery, the battery state estimation method comprising:
measuring a plurality of complex impedances of the rechargeable battery by supplying measurement power to the rechargeable battery;
calculating a parameter that includes a ratio of a difference between measurement angular velocities of two complex impedances in a diffusion region among the measured complex impedances to a difference between components of the two complex impedances; and
estimating a charged electric charge quantity of the rechargeable battery based on the calculated parameter and preset correlated information between the charged electric charge quantity of the rechargeable battery and the parameter.

13. A battery state estimation method for estimating a temperature of a rechargeable battery, the battery state estimation method comprising:
acquiring a charged electric charge quantity of the rechargeable battery;
measuring a plurality of complex impedances of the rechargeable battery by supplying measurement power to the rechargeable battery;
calculating a parameter that includes a ratio of a difference between measurement angular velocities of two complex impedances in a diffusion region among the measured complex impedances to a difference between components of the two complex impedances; and
estimating a temperature of the rechargeable battery by applying the acquired charged electric charge quantity and the calculated parameter to preset information indicating a relationship between the parameter for the charged electric charge quantity of the rechargeable battery and a temperature of the rechargeable battery.

* * * * *